United States Patent
Bleeker et al.

(10) Patent No.: US 7,177,012 B2
(45) Date of Patent: Feb. 13, 2007

(54) LITHOGRAPHIC APPARATUS AND DEVICE MANUFACTURING METHOD

(75) Inventors: Arno Jan Bleeker, Waalre (NL); Kars Zeger Troost, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 180 days.

(21) Appl. No.: 10/966,147

(22) Filed: Oct. 18, 2004

(65) Prior Publication Data

US 2006/0082752 A1  Apr. 20, 2006

(51) Int. Cl.
G03B 27/72 (2006.01)
G03B 27/42 (2006.01)
G03B 27/54 (2006.01)

(52) U.S. Cl. .............. 355/69; 355/53; 355/67
(58) Field of Classification Search .......... 355/53, 355/55, 67–71; 430/5, 20, 30; 250/548, 250/559.1
See application file for complete search history.

(56) References Cited

U.S. PATENT DOCUMENTS

| | | | |
|---|---|---|---|
| 4,508,453 A | 4/1985 | Hara et al. | |
| 5,048,968 A * | 9/1991 | Suzuki | 356/401 |
| 5,229,872 A | 7/1993 | Mumola | |
| 5,296,891 A | 3/1994 | Vogt et al. | |
| 5,475,491 A | 12/1995 | Shiozawa | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,195,114 B1 | 2/2001 | Fujita | |
| 6,525,804 B1 * | 2/2003 | Tanaka | 355/53 |
| 6,618,185 B2 * | 9/2003 | Sandstrom | 359/292 |
| 6,687,041 B1 | 2/2004 | Sandstrom | |
| 6,696,008 B2 * | 2/2004 | Brandinger | 264/400 |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,965,119 B2 * | 11/2005 | Sandstrom et al. | 250/559.1 |

(Continued)

FOREIGN PATENT DOCUMENTS

WO  WO 98/33096  7/1998

(Continued)

OTHER PUBLICATIONS

European Search Report, from European Patent Appln. No. 05256273.3, 10 pages, dated Jan. 9, 2006.

*Primary Examiner*—Henry Hung Nguyen
(74) *Attorney, Agent, or Firm*—Stern, Kessler, Goldstein & Fox P.L.L.C.

(57) ABSTRACT

Lithographic apparatus using an array of individually controllable elements in which a fraction of the intensity of the beam of radiation patterned by the array of individually controllable elements is diverted to an image sensor for verifying the quality of the image generated.

27 Claims, 6 Drawing Sheets

U.S. PATENT DOCUMENTS

| | | |
|---|---|---|
| 2001/0045690 A1 | 11/2001 | Brandinger |
| 2003/0099026 A1 | 5/2003 | Sandstrom |
| 2004/0041104 A1 | 3/2004 | Liebregts et al. |
| 2004/0053143 A1 | 3/2004 | Sandstrom |
| 2004/0130561 A1 | 7/2004 | Jain |
| 2005/0007572 A1 | 1/2005 | George et al. |

FOREIGN PATENT DOCUMENTS

| | | |
|---|---|---|
| WO | WO 98/38597 | 9/1998 |
| WO | WO 03/046662 A1 | 6/2003 |

* cited by examiner

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

In lithographic apparatus using a mask or reticle, in which the pattern is fixed, the image generated by the patterning means remains substantially constant over time, although it can degrade to some extent. Consequently, a manufacturer using such a lithographic apparatus has a relatively high level of confidence that the image being generated and projected onto a particular substrate is correct. However, when using an apparatus with an array of individually controllable elements as the patterning means, the pattern is dynamic and the manufacturer has less confidence that the image being produced and projected onto the substrate is correct until the exposed pattern on the substrate has been developed and the substrate has been inspected. Consequently, a greater number of more detailed inspections of the substrate must be performed after each pattern has been developed on the substrate and a larger amount of re-work can be required.

Therefore, what is needed is an arrangement that provides a manufacturer using a lithographic apparatus with a greater degree of confidence in accuracy and quality of an image being produced, enabling a reduction in inspection time of patterns after exposure and/or a reduction in an amount of re-work.

SUMMARY OF THE INVENTION

According to an aspect of the invention, there is provided a lithographic apparatus comprising an illumination system, an array of individually controllable elements, a substrate table, a beam divider, a projection system, and an image sensor. The illumination system conditions a beam of radiation. The array of individually controllable elements imparts the beam with a pattern in its cross-section. The substrate table supports a substrate. The beam divider divides the intensity of the patterned beam of radiation into at least two fractions, each having substantially the complete cross-section of the pattern. The projection system that projects a first fraction of the patterned beam onto a target portion of the substrate. The image sensor inspects at least a portion of the cross-section of a second fraction of the patterned beam.

According to a further aspect of the invention, there is provided a device manufacturing method comprising the following steps. Providing a substrate. Conditioning a beam of radiation using an illumination system. Using an array of individually controllable elements to impart the beam with a pattern in its cross-section. Dividing the intensity of the patterned beam of radiation into at least two fractions, each having substantially the complete cross-section of the pattern. Projecting a first fraction of the patterned beam of radiation onto a target portion of the substrate. Inspecting at least a portion of the cross-section of a second fraction of the patterned beam of radiation with an image sensor.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the mask and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
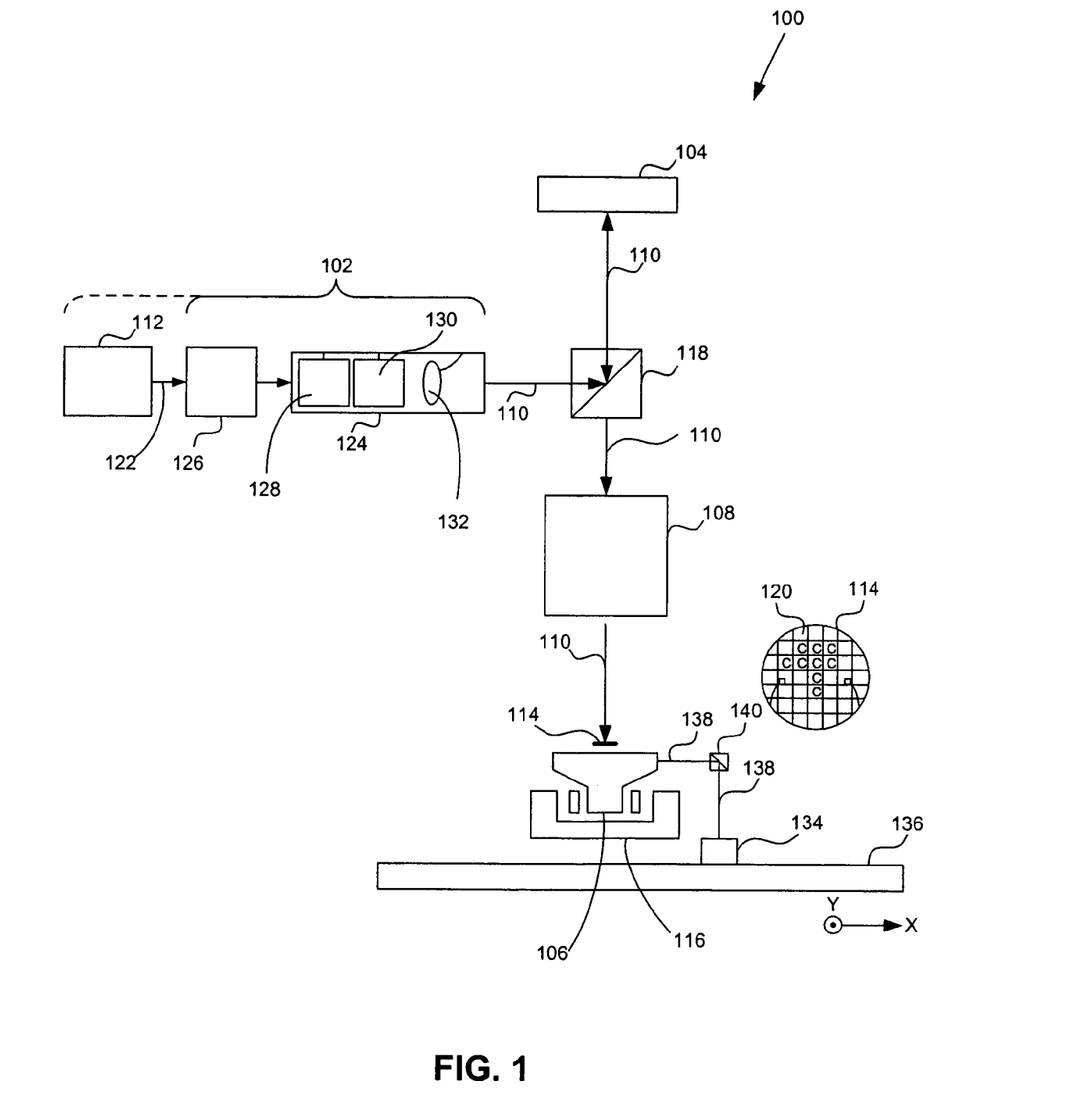
FIG. 1 depicts a lithographic apparatus, according to one embodiment of the present invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and substrate table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

Exemplary Inspection Systems

Figure 2:
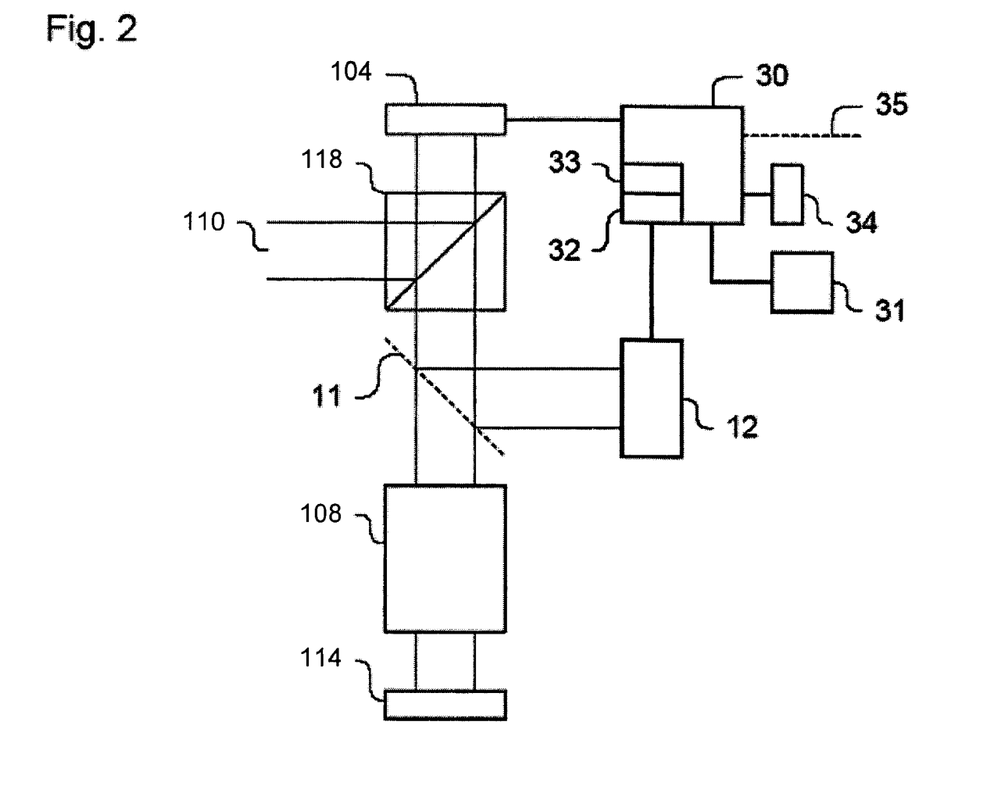
FIGS. 2, 3 and 4 depict arrangements of an inspection system of a lithographic apparatus, according to various embodiments of the present invention.
Figure 3:
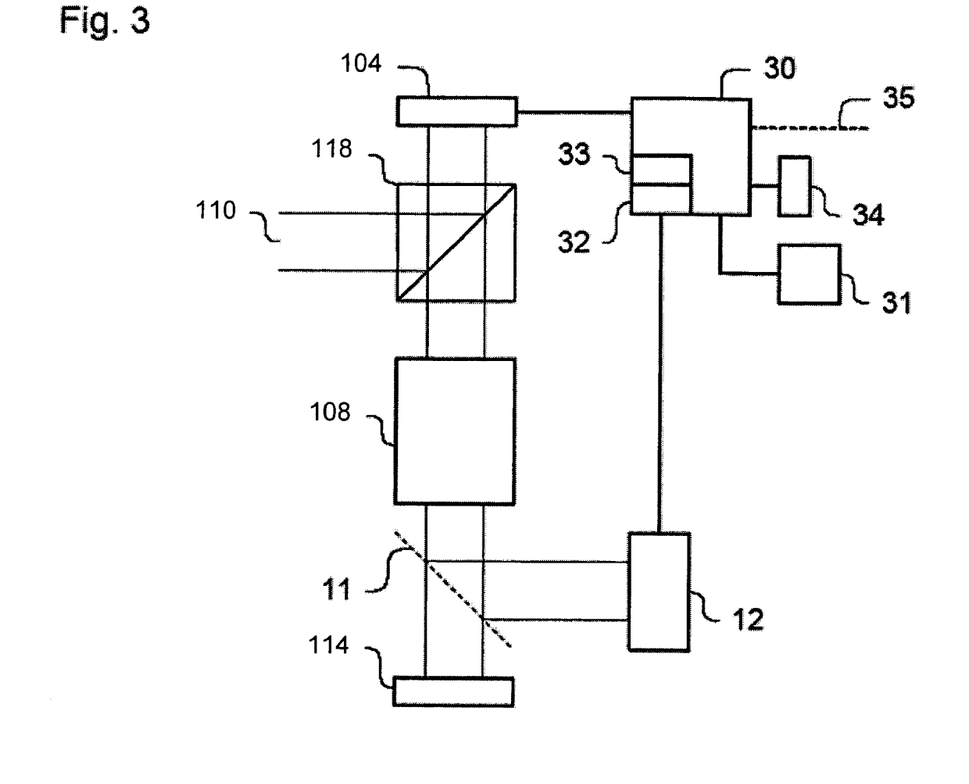
Figure 4:
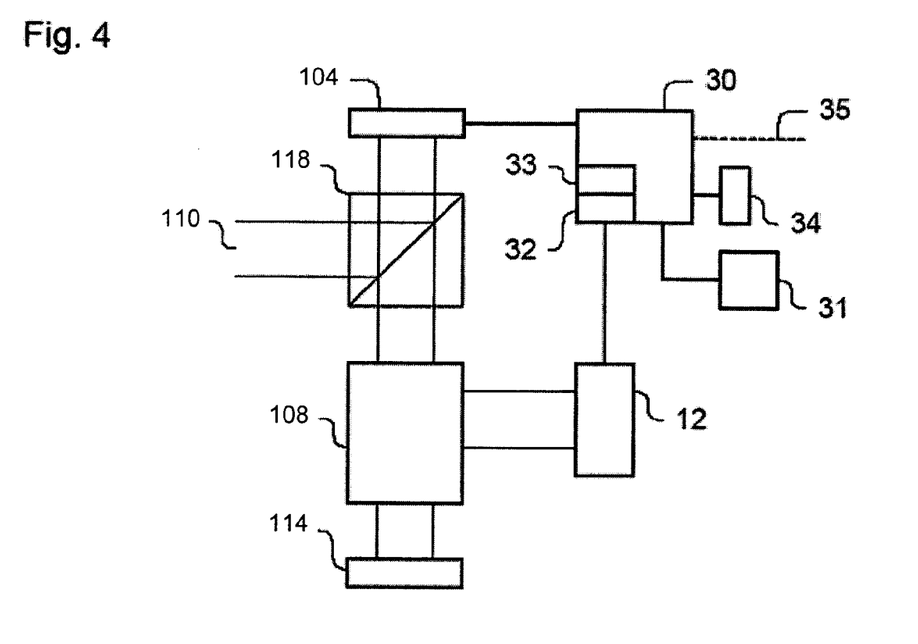

FIGS. 2, 3 and 4 depict arrangements of an inspection system of a lithographic apparatus, according to various embodiments of the present invention.

FIG. 2 shows an arrangement for directing patterned beam 110 onto substrate 114 and an inspection system, according to one embodiment of the present invention. As discussed above, beam 110 is reflected by beam splitter 118 onto array of individually controllable elements 104. Array of individually controllable elements 104 modulates beam 110 and reflects it back, as a patterned beam, through beam splitter 118 to projection system 108 that projects the patterned beam onto substrate 114. It is to be appreciated, however, that an alternative arrangement for illuminating array of individually controllable elements 104 and projecting the patterned beam onto substrate 114 can also be used in conjunction with the present invention.

In one example, a partially reflective mirror 11 is arranged in a path of patterned beam 110. This diverts a small fraction of the intensity of the patterned beam of radiation across its entire cross-section to an image sensor unit 12. The remainder of the patterned beam passes through partially reflective mirror 11. Accordingly, the effect of partially reflective mirror 11 on the patterned beam of radiation that is projected onto substrate 114 is merely a slight reduction in the intensity of the radiation uniformly across its cross-section, and causes no change in the relative intensities of the different parts of the pattern across the cross-section of the patterned beam of radiation. Similarly, the beam of radiation diverted to image sensor unit 12 is an attenuated version of the patterned beam of radiation. In this example, the information relating to the patterned beam projected onto substrate 114 is retained in the diverted portion of the patterned beam of radiation. Furthermore, in this example, the fraction of the radiation intensity diverted by partially reflective mirror 11 remains constant. Consequently, after suitable calibration, measuring the intensity of a portion of the diverted fraction of the patterned beam, allows a determination of the intensity of the corresponding portion of the fraction of the patterned beam projected onto substrate 114. Accordingly, the pattern that is actually being exposed on substrate 114 at any one time can be simultaneously inspected and verified. Similarly, if any errors are discovered, the exposure can be modified or terminated as appropriate.

As shown in FIGS. 2, 3 and 4, respectively, the location at which the fraction of the patterned beam of radiation that is diverted to image sensor unit 12 is not fixed. For example, as shown in FIG. 2, partially reflective mirror 11 can be located prior to the patterned beam of radiation entering projection system 108 or, as shown in FIG. 3, partially reflective mirror 11 can be arranged between projection system 108 and substrate 114. One reason for using the latter configuration is that the image that is inspected is substantially identical to that which is projected onto substrate 114, namely it includes any distortions introduced in the projection system.

In one example, space between projection system 108 and substrate 114 can be limited, rendering the configuration of FIG. 3 less desirable, and the configuration of FIG. 2 more desirable.

In one example, the image can be de-magnified in projection system 108. Therefore, if the image is to be inspected after projection system 108, the sensitivity of image sensor unit 12 can need to be greater than that required to inspect the image before projection system 108.

In another example, as shown in FIG. 4, partially reflective mirror 11 is positioned within projection system 108, namely between two of the optical components within projection system 108. This provides a compromise between the requirements for image sensor unit 12 and the extent to which it can detect distortions created in projection system 108, but increases the complexity of projection system 108.

Although the invention has been described above in terms of using a partial mirror 11, it will be appreciated that alternative devices can also be used in its place provided that the patterned beam of radiation has its intensity divided, such that a first fraction of the patterned beam of radiation is directed to substrate 114 and a second fraction is diverted to image sensor unit 12. For example, a beam splitter (not shown) can also be used in place of partially reflective mirror 11. It will be appreciated that different components can be better adapted for use at different locations at which the fraction of the patterned beam is diverted. As an alternative, the component used to divide the patterned beam of radiation can be a component that is also used to illuminate array of individually controllable elements 104 and/or to direct the patterned beam of radiation into projection system 108.

Exemplary Image Sensors

In one example, image sensor unit 12 can inspect the entire cross-section of the patterned beam of radiation. Alternatively, however, image sensor unit 12 can only inspect a portion of the cross-section of the patterned beam of radiation at one instant. The former arrangement can allow the entirety of the image being projected onto substrate 114 to be verified on a continuing basis. However, the accuracy of the patterned beam projected onto substrate 114 can be sufficient that the cost of such a large image sensor and the cost of providing a correspondingly large image analysis and verification system can not be justified.

FIGS. 5, 6, 7, and 8 depict image sensors, according to various embodiments of the present invention.

Figure 5:
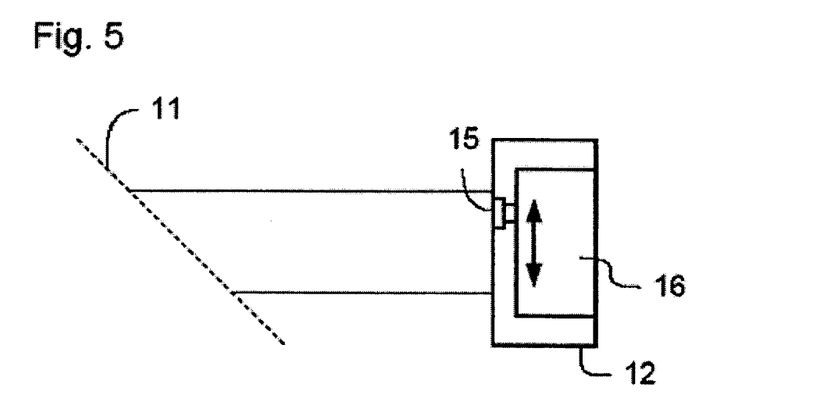
FIGS. 5, 6, 7, 8, and 9 depict image sensors, according to various embodiments of the present invention.

In this latter case, an image sensor unit 12 such as that shown in FIG. 5 can be provided. Image sensor unit 12 has an image sensor 15 that inspects a portion of the cross-section of the patterned beam of radiation at any given time. Image sensor unit 12 also includes an actuator system 16 that moves image sensor 15 to a desired portion of the cross-section of the patterned beam of radiation. For example, using this arrangement the entirety of the cross-section of the patterned beam of radiation can be inspected using a smaller and possibly cheaper image sensor 15, which can allow for correspondingly reduced data handling and image analyzing systems.

Figure 6:
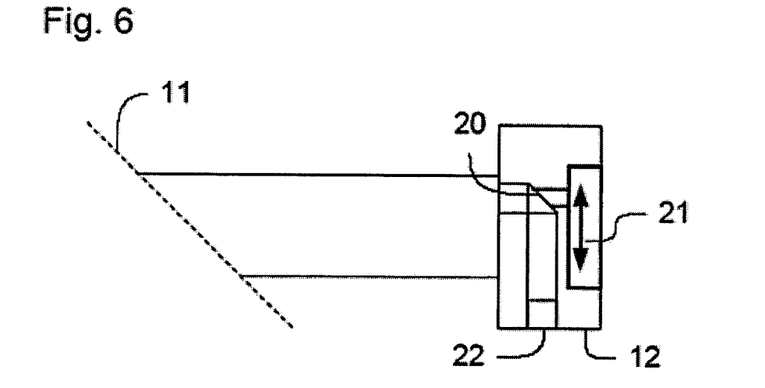

In another example, as shown in FIG. 6, instead of moving the position of image sensor 15, an arrangement such as schematically represented by FIG. 6 can be used instead. An image sensor unit 12 shown in FIG. 6 has a fixed image sensor 22 that is also capable of inspecting a portion of the cross-section of the patterned beam of radiation. Image sensor unit 12 also comprises a mirror 20 for reflecting a portion of the patterned beam of radiation to image sensor 22. An actuator 21 moves mirror 20 to select a desired portion of the cross-section of the patterned beam of radiation to inspect and reflect the selected portion to image sensor 22. Such an arrangement can be beneficial because it simplifies the connection of the data path between image sensor 22 and the remainder of the apparatus (in contrast with the arrangements shown in FIG. 5 in which the image sensor itself moves).

Although FIGS. 5 and 6 only show image sensors 15,22 that can select portions of the cross-section of the patterned beam of radiation in one dimension, it will be appreciated that image sensor unit 12 can be configured to select portions in two dimensions across the cross-section of the patterned beam of radiation.

It will also be appreciated that, although FIG. 6 shows an arrangement in which mirror 20 is translated, any suitable arrangement of optical elements for selectively diverting a portion of the cross-section of the patterned beam of radiation to sensor 22 can also be used.

Figure 9:
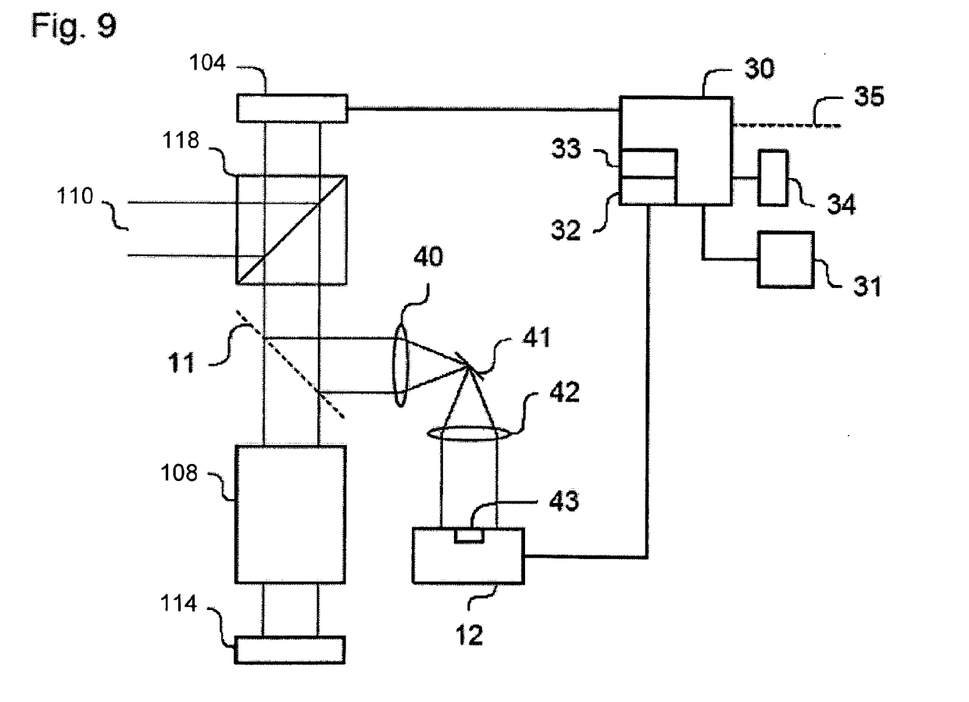

FIG. 9 shows such an alternative arrangement for an image sensor unit 12 compared to those described above. In this case, the fraction of the intensity of the patterned beam of radiation directed to image sensor unit 12 is focused onto a rotatable mirror 41 by means of a lens or lens group 40. The reflected radiation is subsequently reformed into a parallel beam of radiation by means of lens or lens group 42. Accordingly, by setting the angle of mirror 41, it is possible to select the portion of the cross-section of the patterned beam of radiation that is incident on an image sensor 43 within image sensor unit 12.

In one example, by arranging rotating reflector 41 at focal points of lenses 40,42, the required size of reflector 41 is significantly reduced. Accordingly, the actuator necessary to control the position of the reflector 41 can likewise be relatively small.

In one example, reflector 41 is controlled by high-precision actuators such as piezo-electric actuators.

In one example, a speed at which reflector 41 can be actuated is greater because of the smaller size of reflector 41.

Similar configurations of rotating mirrors can also be used.

It will also be appreciated that partially reflective mirror 11 that diverts a fraction of the patterned beam of radiation to image sensor unit 12 can itself be rotatably mounted to select the portion of the cross-section of the patterned beam of radiation that is incident on the image sensor within image sensor unit 12. Such an arrangement can, however, introduce additional complexities because the adjustment of the angle of partially reflective mirror 11 can affect the proportion of the intensity of the radiation that is directed into projection system 108 or onto substrate 114, depending on the position of partially reflective mirror 11. Accordingly, additional calibration can be required to avoid introducing additional errors into the exposure process.

In one example, lithographic apparatus 100 can include more than one array of individually controllable elements 104 that are simultaneously illuminated to provide a single patterned beam of radiation. The individual arrays of individually controllable elements 104 can be set apart from one another in order to provide space around the arrays for the input of control signals and other services such as cooling conduits. Accordingly, there will be a plurality of patterned portions distributed within the patterned beam of radiation but set apart from one another.

In one example, if the apparatus has a single image sensor configured to inspect portions of the cross-section of the patterned beam of radiation, the required stroke of the actuator for moving the sensor (or moving an optical component to select the portion of the cross-section of the patterned beam of radiation directed to the image sensor) will need to be relatively large in order to enable it to inspect the cross-sections of each of the patterned areas within the patterned beam of radiation.

In an alternative arrangement, however, image sensor unit 12 can include an image sensor associated with each of the arrays of individually controllable elements 104. The relative positions of the image sensors can be arranged at a fixed separation from one another corresponding to the separation of the corresponding patterned areas within the patterned beam of radiation.

For example, in an arrangement corresponding to that shown in FIG. 5, the image sensors can be mounted together on actuator 16 with a fixed separation relative to each other such that, across the stroke of actuator 16, each of the individual image sensors traverses the patterned portion of the patterned beam corresponding to one of the arrays of individually controllable elements.

Similarly, in configurations that correspond to those shown in FIGS. 6 and 9, the image sensors can be fixed in positions relative to each other such that, as an optical component is actuated, the portions of the patterned beam that are directed to each of the image sensors are corresponding portions of each of the patterned areas within the patterned beam of radiation generated by respective arrays of individually controllable elements. Accordingly, in such arrangements, only a single actuator or actuator system (and corresponding actuator control system) is required to select the portions of the cross-section of the patterned beam of radiation inspected by each of the image sensors, but the required stroke of the actuator is less than would be needed if one of the image sensors were required to be able to inspect the entire cross-section of the patterned beam of radiation.

In one example, the image sensor used can have a greater number of sensing pixels than the number of individually controllable elements that form the pattern for the portion of the cross-section of the patterned beam of radiation inspected by image sensor unit 12. This provides increased sensitivity, ensuring that even minor variations from the intended image are detected.

In one example, the image sensor has four times as many pixels, or more, than are in the part of the array of individually controllable elements 104 that forms the portion of the patterned beam of radiation that the image sensor inspects. For example, a four million pixel image sensor can inspect the portion of the cross-section of the patterned beam of radiation generated by one million of the individually controllable elements in array of individually controllable elements 104.

Figure 7:
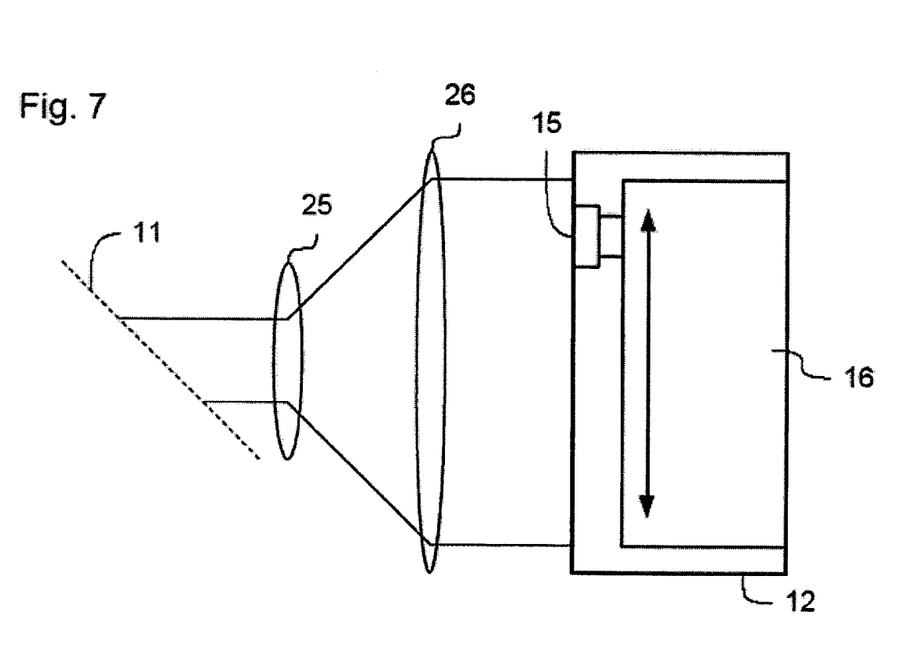

Depending on the position in the beam path of the patterned beam of radiation that the fraction of the patterned beam of radiation for the image sensor is extracted, and depending on the spacing of the pixels of the image sensor, the diverted fraction of the patterned beam of radiation can need to be magnified. For example, as shown in FIG. 7, the entire cross-section of the diverted fraction of the patterned beam of radiation can be magnified with optical elements 25,26. Magnifying the entirety of the diverted fraction of the patterned beam of radiation reduces the requirement for the accurate position control of image sensor 15 (although it correspondingly increases the required stroke of the actuator).

Figure 8:
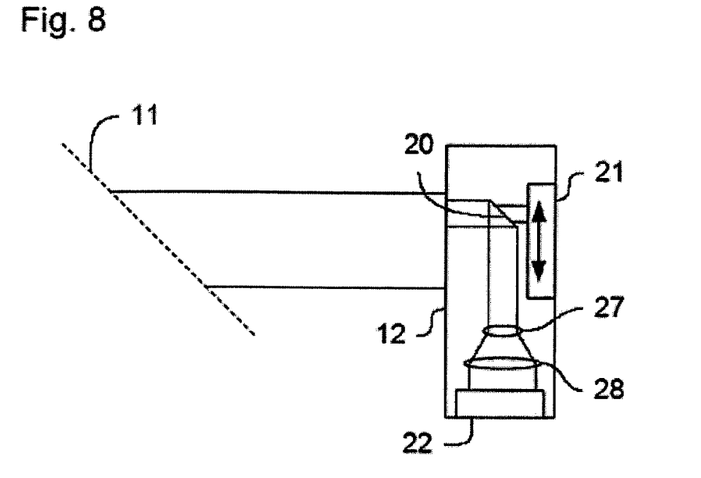

Alternatively, as shown in FIG. 8, image sensor unit 12 can be configured such that only the portion of the cross-section of the diverted portion of the patterned beam of radiation is magnified by optical elements 27,28 before being inspected by image sensor 22. This can allow for the reduction in size of the optical components required.

It will be appreciated that, although the magnifying arrangement of FIG. 7 is shown in conjunction with the image sensor unit of FIG. 5 and the magnifying arrangement of FIG. 8 is shown in conjunction with the image sensor unit of FIG. 6, both magnifying arrangements can equally be used with either arrangement for selecting the portion of the cross-section of the patterned beam to inspect. Furthermore, other well-known arrangements for magnifying beams of radiation can also be used.

In various examples, the image sensor used can be a CCD or a CMOS sensor, as would become apparent to one of ordinary skill in the art upon reading this description.

In one example, image sensor unit 12 can not only be used for verifying images as they are projected onto substrate 114, but can also be used prior to exposures or during set up of lithographic apparatus 100 for calibration tests. During such calibration tests, partially reflective mirror 11 can be replaced if required by a plain reflector. The calibration tests can, for example, be used to set up or verify the alignment of components within the lithographic apparatus or to optimize the control of the array of individually controllable elements. The latter can involve determining the response of the individually controllable elements to a range of control signals. By utilizing the image sensor for both tasks, the overall cost of lithographic apparatus 100 is reduced.

In one example, more than one image sensor can be used within an image sensor unit 12 to inspect a given portion of the cross-section of the patterned beam of radiation. They can be arranged adjacent to one another or with a separation between them, for example, for control circuits for the image sensors. In the latter case, the selection of the portions of the cross-section of the diverted fraction of the patterned beam of radiation is arranged such that the complete cross-section can be inspected. For example, the portion of the cross-section between two sensors during one inspection is subsequently inspected during a later inspection.

In one example, more than one image sensor unit 12 can also be used. In such an arrangement, the patterned beam of radiation can be split to form one slightly attenuated patterned beam of radiation that is directed to the substrate and two or more significantly attenuated patterned beams of radiation that are each diverted to a separate image sensor unit. The beam can be split into such fractions at one location (for example, before the patterned beam enters the projection system) or the fractions of the beam for the image sensors can be diverted at different locations in the patterned beam path (for example, one before the projection system and one after the patterned beam exits the projection system). Such a configuration enables the identification of sources of image distortion within the lithographic apparatus (for example, within the projection system).

Exemplary Inspection Systems Utilizing Polarization Techniques

In one example, it can be desirable to illuminate substrate 114 with separate patterns for radiation that is plane polarized in different orientations. For example, certain features of a pattern can be exposed using radiation that is plane polarized in a first direction and other features exposed using radiation that is plane polarized in a direction orthogonal to the first direction. The two patterns can, depending on the configuration of lithographic apparatus 100, be exposed simultaneously.

Figure 10:
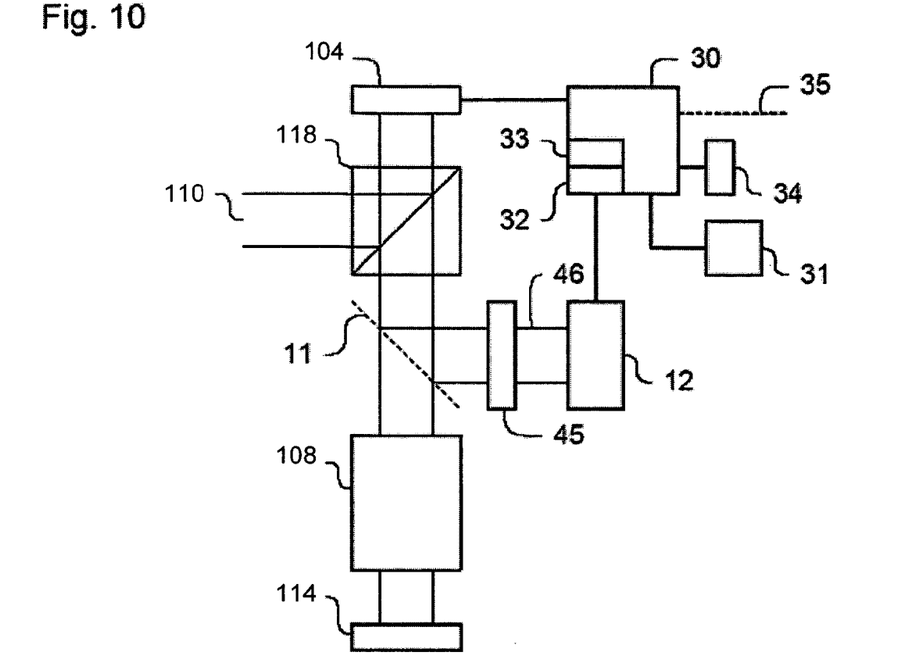
FIGS. 10 and 11 depict inspection systems, according to various embodiments of the present invention.
Figure 11:
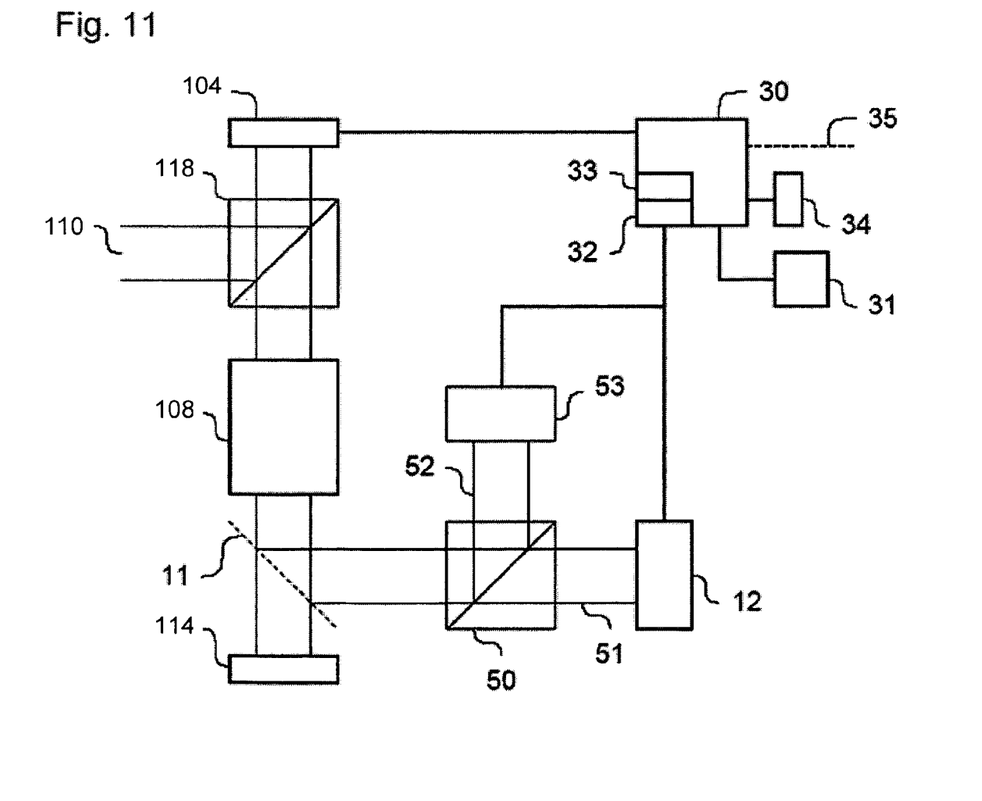

FIGS. 10 and 11 depict inspection systems, according to various embodiments of the present invention.

FIG. 10 shows an arrangement of the present invention that can be used to inspect the pattern within the patterned beam of radiation where plane polarized radiation is being used. In this case, lithographic apparatus 100 includes a plane polarizing filter 45 that filters the fraction of the patterned beam of radiation that is diverted to image sensor unit 12. In this example, radiation that is plane polarized in a given direction is included in fraction 46 of the patterned beam of radiation that is inspected by image sensor unit 12. Accordingly, image sensor unit 12 can inspect the pattern for radiation that is plane polarized in a particular direction even if the patterned beam of radiation also includes patterns formed from radiation that is differently polarized.

In one example, plane polarizing filter 45 is adjustable, such that it can be set to select radiation that is plane polarized in any direction. Accordingly, image sensor unit 12 can inspect the pattern for any selected plane polarized radiation within the patterned beam of radiation.

FIG. 11 shows a further variation of the apparatus of the present invention, allowing inspection of patterns of plane polarized radiation within the patterned beam of radiation. In the arrangement shown in FIG. 11, the diverted fraction of the patterned beam of radiation is directed into a polarizing beam splitter 50. Polarizing beam splitter 50 divides the diverted fraction of the patterned beam of radiation into two plane polarized sub-fractions of radiation 51,52 that correspond, respectively, to radiation in the diverted fraction of the patterned beam of radiation that is plane polarized in a first direction and that is plane polarized in a second direction, orthogonal to the first direction.

In this embodiment, apparatus 100 further includes a second image sensor unit 53 in addition to first image sensor unit 12. The two image sensor units 12,53 are each arranged to inspect one of the plane polarized sub-fractions of the patterned beam of radiation. Accordingly, it is possible to simultaneously inspect the patterns within the patterned beam of radiation for orthogonally plane polarized radiation.

It will be appreciated that the arrangements shown in FIGS. 10 and 11 for inspecting the patterns of plane polarized radiation within the patterned beam of radiation can be applied to inspect fractions of the patterned beam of radiation that are diverted before the radiation is directed into projection system 108, radiation that is diverted from projection system 108, and radiation that is diverted between projection system 108 and substrate 114.

In one example, with reference again to FIG. 2, apparatus 100 is provided with a controller 30 that compares the image detected by image sensor unit 12 with an intended image. In one example, this is performed by comparing the data from the image sensor with the pattern data used to generate the control signals for array of individually controllable elements 104. Accordingly, the actual image being generated (and exposed on substrate 114) is compared with the image that should be exposed on substrate 114. Furthermore, because the actual generated image can be inspected as it is being generated, the comparison can be made without reference to the actual position on substrate 114 on which the image is being projected, thereby simplifying the comparison.

In one example, a measurement is made of the position of substrate 114 relative to the position of the image being projected onto it in order to verify that the overlay of the image onto substrate 114 is correct.

In one example, the pattern data representing the intended image that is used in the comparison performed by controller 30 is the same data as is used to provide the control signals for array of individually controllable elements 104. Controller 30 accesses a same memory and uses the same data as is used to generate the control signals for array of individually controllable elements 104.

In one example, the data stored for use in generating the control signals for array of individually controllable elements 104 can be pre-processed to reduce the computation required during the exposure. In this case, controller 30, when comparing the actual image generated with the intended image, accesses a separate memory containing data representing the pattern rather than data representing the settings required for array of individually controllable elements 104.

In one example, controller 30 is configured such that if it determines the difference between the intended image and the image detected by the image sensor exceeds a predetermined threshold, it terminates the exposure of substrate 114. In this example, substrate 114 can require re-work, as in conventional apparatus. However, by terminating the exposure of substrate 114 as soon as the quality of the exposed image deteriorates below an acceptable level, no time is wasted exposing the remainder of substrate 114.

In one example, after terminating the exposure of substrate 114, controller 30 can automatically commence a re-calibration procedure in order to ensure that any difference between the intended image and the actual image is sufficiently lowered before the exposure of the next substrate that adequate image quality can be verified. Alternatively, or additionally, control system 30 can, for example, be configured to alert an operator that there is a fault.

In one example, controller 30 is configured to update the calibration of the control of the individually controllable elements in the array of individually controllable elements 104 based on any differences identified between the image detected by the image sensor and the intended image during the exposure of substrate 114. In this example, the quality of the image is maintained and verified without needing to interrupt the exposure of a substrate. As a result, the proportion of the time that apparatus 100 is exposing substrates rather than being calibrated is increased, improving the efficiency of apparatus 100.

In one example, controller 30 controls array of individually controllable elements 104. In another example, there can be a separate controller for controlling array of individually controllable elements 104 and that receives data from controller 30 corresponding to any updates required of the calibration for controlling the individually controllable elements.

In one example, a comparison of the inspected image and the determination of whether or not the difference is within acceptable tolerances consists of comparing the intended and actual intensity of radiation in the patterned beam for each individually controllable element. The threshold can, for example, be based on a calculation of the average intensity error per individually controllable element across the inspected portion of the patterned beam and/or a maximum allowable error per individually controllable element. The maximum intensity error permitted per individually controllable element can be the same for the entire cross-section of the patterned beam of radiation. Alternatively, the maximum permissible error can vary depending on the location of the individually controllable element or individually controllable elements in the pattern being formed. For example, the permissible error can be small for individually controllable elements forming the edges of a feature than within a large block of uniform intensity.

In one example, the determination that the image quality has deteriorated beyond an acceptable threshold can also be based on the average intensity error for a group of individually controllable elements or for a region within the inspected portion of the patterned beam (namely not analyzing the response of individual individually controllable elements). For example, a relatively large error in a single individually controllable element within a group of other individually controllable elements that are functioning correctly can have less impact on the image quality than a relatively small error in all of the individually controllable elements in that group. Controller 30 can monitor the average error for groups of individually controllable elements of a certain size. Alternatively, it can monitor the average error within the individually controllable elements that pattern the beam of radiation for a given feature of the pattern being formed.

In one example, controller 30 analyzes the image detected by the image sensor to identify any individually controllable elements within the array of individually controllable elements 104 that do not respond to the control signals provided to them. Such individually controllable elements cause a significant reduction in the image quality. Such individually controllable elements can be permanently off, causing dark spots in the patterned beam of radiation, permanently on, causing bright spots in the patterned beam of radiation or permanently part way between. Controller 30 can identify the pixels by comparing multiple inspected images and identifying any individually controllable elements that do not change regardless of the intended pattern. In addition to identifying individually controllable elements of fixed contrast in this manner, the controller 30 can identify individually controllable elements which have a smaller than required range of response.

As shown in FIG. 2, lithographic apparatus 100 has a display 31 that displays the image detected by image sensor unit 12. Accordingly, it is possible for an operator to visually monitor the actual pattern being formed.

In one example, display 31 can display the corresponding portion of the pattern that is intended to be formed in overlapping registry with the detected image. Accordingly, the operator is able to visually gauge whether or not the image quality is acceptable and identify any errors.

In one example, display 31 can display features of substrate 114, such that the operator can identify if the pattern being formed in that process is correctly located on substrate 114. The features of substrate 114 that can be displayed include features of the device being formed on the substrate that have already been formed (namely earlier layers), features of the device being formed that are to be formed in subsequent processing steps, boundaries between two or more adjacent devices being formed on the substrate and boundaries between parts of the substrate being exposed at different times. The latter features can be critical. Different parts of a pattern being formed on a substrate can be exposed with different exposures. Accordingly, it is essential that the different parts of the pattern are adequately aligned with one another and with the appropriate amount of overlap.

In one example, controller 30 includes a memory 32 for storing image data representing the image detected by the image sensor such that display 31 can simultaneously display images detected by image detector unit 12 at different times. This is especially useful for monitoring the boundaries between subsequent exposures as discussed above. Accordingly, memory 32 also records information corresponding to the position of the exposures on substrate 114.

In one example, lithographic apparatus 100 includes an interface 34, as shown in FIG. 2, through which an operator can select the image to be displayed on display 31. In one example, the operator selects the portion of the cross-section of the diverted fraction of the patterned beam that is inspected, namely to inspect the performance of a given group of individually controllable elements within the array of individually controllable elements. The operator can additionally or alternatively be able to select the image that has been projected onto a given location on substrate 114, for example to confirm the overlay with a previous layer.

Alternatively or additionally, the operator can select a given portion of a repeating unit within a pattern that is being projected onto substrate 114. In this case, controller 30 can be configured to display the selected portion of the pattern when it is next exposed on substrate 114, can be configured to display the selected portion of the pattern from a previous exposure or can be configured to simultaneously display the selected portion of the pattern in all incidences that it has been exposed on the substrate in overlapping registry such that they can be compared.

In one example, controller 30 can also include an image analyzer 33, as shown in FIG. 2. Analyzer 33 calculates an image quality coefficient of the pattern being formed on substrate 114 rather than simply comparing the actually produced intensity values for each individually controllable elements with the intended intensity values or comparing the actual pattern with the intended pattern. Such an analyzer 33 can determine a size of critical features of the device being formed, i.e., calculate a CD (Critical Dimension) value.

It will be appreciated that the determination of the acceptability of the pattern formed on substrate 114, as discussed above, can also be based on the CD value determined by image analyzer 33.

In one example, the image quality coefficient, or CD value, is stored in memory 32, such that the coefficients can be accessed for at least one of a substrate, a particular area on a substrate, a batch of substrates exposed by the lithographic apparatus, a device formed on a substrate, a common part of a plurality of devices formed on a substrate and over a specified time for the lithographic apparatus. Accordingly, an operator can compare the performance of lithographic apparatus 100 for a particular substrate, batch of substrates or part of the exposure of one substrate with each other or the performance of the lithographic apparatus.

In one example, the operator can confirm the CD value for critical parts of a device being formed on the substrate.

In one example, lithographic apparatus 100 can further have an interface 35 for connecting controller 30 to at least one of another apparatus that will subsequently process a substrate exposed by the apparatus (enabling that apparatus to compensate for any deficiencies in the image quality or variations in the CD, where possible), a central controller that monitors the production quality of a plurality of apparatus including the lithographic apparatus (enabling the verification of the overall production quality of a production facility) and an independent inspector, such as a third party company, for verifying the production quality of the lithographic apparatus.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus comprising:
   an illumination system that conditions a beam of radiation;
   an array of individually controllable elements that pattern the beam;
   a beam divider that divides an intensity of the patterned beam into at least first and second fractions, each having substantially a complete cross-section of the pattern;
   a projection system that projects the first fraction of the patterned beam onto a target portion of a substrate; and
   an image sensor that inspects at least a portion of the cross-section of the second fraction of the patterned beam,
   wherein the beam divider is positioned between a last element of the projection system and the substrate.

2. The lithographic apparatus of claim 1, further comprising:
   an actuator that moves the image sensor to select the portion of the cross-section of the second fraction of the patterned beam that is inspected.

3. The lithographic apparatus of claim 1, further comprising:
   one or more moveable optical components and associated actuators configured to select the portion of the cross-section of the second fraction of the patterned beam that is inspected.

4. The lithographic apparatus of claim 1, wherein the portion of the patterned beam inspected by the image sensor is magnified.

5. The lithographic apparatus of claim 1, wherein a number of sensing pixels in the image sensor is greater than a number of individually controllable elements in the array of individually controllable elements corresponding to the portion of the cross-section of the patterned beam that is inspected by the image sensor.

6. The lithographic apparatus of claim 1, wherein a number of sensing pixels in the image sensor is at least 4 times or greater than a number of individually controllable elements in the array of individually controllable elements corresponding to the portion of the cross-section of the patterned beam that is inspected by the image sensor.

7. The lithographic apparatus of claim 1, further comprising:
   a polarizing filter positioned between the beam divider and the image sensor, wherein the radiation reaching the image sensor is substantially only the radiation in the second fraction of the patterned beam that is plane polarized in a given orientation.

8. The lithographic apparatus of claim 7, wherein the polarizing filter is adjusted to select an orientation of the plane polarized radiation that reaches the image sensor.

9. The lithographic apparatus of claim 1, further comprising:
a polarizing beam splitter that divides the second fraction of the patterned beam of radiation into first and second plane polarized sub-fractions of the patterned beam; and
a second image sensor,
wherein the radiation in the first plane polarized sub-fraction corresponds to the radiation in the second fraction of the patterned beam that is substantially plane polarized in a first orientation,
wherein the radiation in the second plane polarized sub-fraction corresponds to the radiation in the second fraction of the patterned beam that is substantially plane polarized in a second orientation, substantially perpendicular to the first orientation, and
wherein said first and second image sensors inspect at least a portion of the cross-section of the first and second plane polarized sub-fractions of the patterned beam, respectively.

10. The lithographic apparatus of claim 1, further comprising:
a controller that compares an image detected by the image sensor with a corresponding portion of an image intended to be projected into the substrate.

11. The lithographic apparatus of claim 10, wherein the controller terminates an exposure of the substrate if the controller determines that the difference between the image detected by the image sensor and the intended image exceeds a predetermined threshold.

12. The lithographic apparatus of claim 10, wherein the controller adjusts a calibration control of the array of individually controllable elements based on a difference between the image detected by the image sensor and the intended image.

13. The lithographic apparatus of claim 10, wherein the controller identifies from one or more exposures which, if any, of the individually controllable elements in the array of individually controllable elements fail to adequately respond to control signals intended to control that individually controllable element.

14. The lithographic apparatus of claim 13, wherein the controller uses the identification to calibrate or adjust the individually controllable elements prior to exposure of the substrate.

15. The lithographic apparatus of claim 1, wherein the image sensor is also used to calibrate control of the individually controllable elements prior to exposure of the substrate.

16. The lithographic apparatus of claim 1, further comprises:
a display that displays the image detected by the image sensor, which allows a user to use the image to calibration the array of individually controllable elements prior to exposure of the substrate.

17. The lithographic apparatus of claim 16, wherein said display further displays a corresponding portion of an intended image in overlapping registry with the image detected by the image sensor.

18. The lithographic apparatus of claim 16, wherein said display further displays features of the portion of the substrate at a position on which the image inspected by the image sensor is exposed on the substrate, in overlapping registry with the image detected by the image sensor.

19. The lithographic apparatus of claim 18, wherein the displayed features of the substrate include at least one of:
a feature of a device being formed on the substrate that has already been formed;
a feature of the device being formed on the substrate that is to be formed;
a boundary between two adjacent devices being formed on the substrate; and
a boundary between parts of the substrate being exposed at different times.

20. The lithographic apparatus of claim 16, further comprising:
a memory that stores image data representing the image detected by the image sensor,
wherein said display substantially simultaneously displays the images detected by the image detector at two or more times during the exposure of the substrate and the relative positions of the respective images projected on the substrate.

21. The lithographic apparatus of claim 16, further comprising:
a user interface that allows a user to select an image inspected by the image sensor for display based on at least one of:
the portion of the cross-section of the diverted fraction of the patterned beam that is inspected;
the image projected onto a selected portion of the substrate; and
the image projected onto the substrate for a selected portion of a repeating pattern projecting onto the substrate.

22. The lithographic apparatus of claim 1, further comprising:
and image analyzer that analyses an image detected by the image sensor and determines a coefficient characterizing a quality of at least a part of the image based on a size of one or more features within the image.

23. The lithographic apparatus of claim 22, further comprising:
a memory that stores the coefficient values determined by the image analyzer, wherein said coefficients or average coefficient values are accessed for at least one of:
the substrate;
a particular area on the substrate;
a batch of the substrates exposed by the lithographic apparatus;
a device formed on the substrate;
a common portion of a plurality of devices on the substrate; and
over a specified time for the lithographic apparatus.

24. The lithographic apparatus of claim 23, further comprising:
an interface for making said coefficient values available to at least one of:
another apparatus that subsequently processes the substrate exposed by the lithographic apparatus;
a central controller that monitors a production quality of a plurality of apparatus including the lithographic apparatus; and
an inspection device that measures the production quality of the lithographic apparatus.

25. A device manufacturing method, comprising:
patterning a beam of radiation using array of individually controllable elements;

dividing an intensity of the patterned beam into at least first and second fractions, each of the first and second fractions having substantially a complete cross-section of the pattern;

projecting the first fraction of the patterned beam onto a target portion of a substrate;

polarization filtering the second fraction of the patterned beam; and inspecting at least a portion of the cross-section of the second fraction of the patterned beam that is plane polarized in a given orientation with an image sensor.

26. A lithographic apparatus, comprising:

an illumination system that conditions a beam of radiation;

an array of individually controllable elements that pattern the beam;

a beam divider that divides an intensity of the patterned beam into at least first and second portions, each of the first and second portions having substantially a complete cross-section of the pattern;

a projection system that projects the first portion of the patterned beam onto a target portion of a substrate; and an image sensor that inspects at least a part of the cross-section of the second portion of the patterned beam, the image sensor including a number of sensing pixels that is greater than a number of individually controllable elements in the array of individually controllable elements, whereby through the greater number of sensing pixels than the individually controllable elements the image sensor is configured, to have increased sensitivity to detect minor variations from an intended image.

27. The lithographic apparatus of claim 26, wherein the beam divider is positioned between a last element of the projection system and the substrate, within the projection system, or between the array of individually controllable elements and the projection system.

* * * * *

UNITED STATES PATENT AND TRADEMARK OFFICE
CERTIFICATE OF CORRECTION

PATENT NO. : 7,177,012 B2
APPLICATION NO. : 10/966147
DATED : February 13, 2007
INVENTOR(S) : Bleeker et al.

It is certified that error appears in the above-identified patent and that said Letters Patent is hereby corrected as shown below:

<u>Column 16</u>
Line 34 please replace "the proiection system" with --the projection system--.

Signed and Sealed this

Tenth Day of April, 2007

JON W. DUDAS
*Director of the United States Patent and Trademark Office*